Dec. 23, 1969 M. F. EISENBERG 3,486,124
POWER SUPPLY AMPLIFIER HAVING MEANS FOR PROTECTING THE OUTPUT TRANSISTORS
Filed June 4, 1968
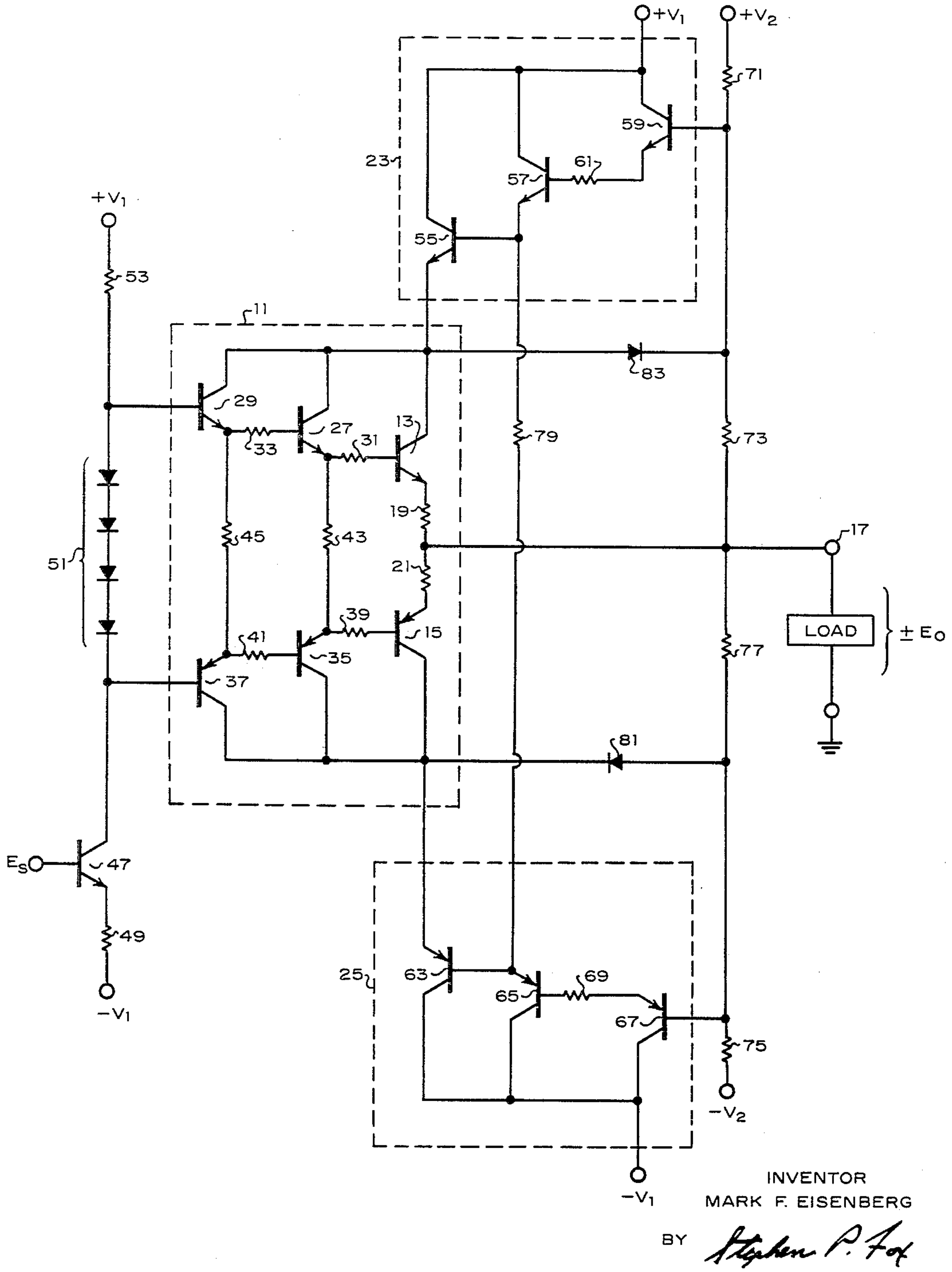
INVENTOR
MARK F. EISENBERG
BY Stephen P. Fox
AGENT United States Patent Office 3,486,124
Patented Dec. 23, 1969

3,486,124

POWER SUPPLY AMPLIFIER HAVING MEANS FOR PROTECTING THE OUTPUT TRANSISTORS

Mark F. Eisenberg, North Plainfield, N.J., assignor to Hewlett-Packard Company, Palo Alto, Calif., a corporation of California Filed June 4, 1968, Ser. No. 734,292
Int. Cl. H03f 3/18
U.S. Cl. 330—13 5 Claims

ABSTRACT OF THE DISCLOSURE

A circuit limits the voltage applied across the nonconducting one of a pair of complementary output transistors in a push-pull amplifier which produces a dual polarity output. First and second regulating transistors respectively divide the positive and negative supply voltages with their corresponding amplifier output transistors in accordance with control signals derived from the amplifier output terminal. The circuit is particularly suitable for high frequency switching applications.

Background of the invention

A recurrent problem in the design of transistorized power amplifiers is that economical commercially available power transistors have low voltage ratings on the order of 20–80 volts and thus are easily destroyed when used to produce high voltage output signals. The problem is compounded in a dual polarity push-pull amplifier wherein two output transistors are connected in series between high positive and negative voltage sources. In this configuration, when one of the two output transistors is conducting, the other transistor is non-conducting and may have twice the supply voltage applied across it.

One common approach in a high voltage transistor power amplifier has been to provide either active or passive elements in series with the output transistors to share or divide the supply voltage therewith and thus limit the voltage across each transistor. However, such prior art devices lack satisfactory control of the voltage divider circuitry, with the result that the output transistors are inadequately protected. That is particularly true in high frequency switching applications where transistor inter-electrode capacitances slow down the amplifier response time and may permit undesirable high voltage transients.

Summary of the invention

The present invention, in one specific embodiment, comprises first and second voltage regulating means for respectively connecting the output transistors of a push-pull power amplifier to their corresponding positive and negative voltage sources. In the illustrated embodiment of the invention, each of the voltage regulating means includes a main regulating transistor and additional transistor driver circuitry, the latter of which is controlled by voltage divider means connected between the amplifier output and a bias voltage. The output transistors are protected by their corresponding regulating transistors which share the supply voltages in proportions that vary in response to the magnitude and polarity of the amplifier output voltage. Also, the power amplifier has a fast response time and is protected against high voltage switching transients.

Brief description of the drawing

The single figure of the drawing illustrates the preferred embodiment of the present invention.

Description of the preferred embodiment

Referring now to the figure, there is shown a push-pull power amplifier 11 including two output transistors 13 and 15 of the NPN and PNP types, respectively. Transistors 13 and 15 have their emitters connected to a common output terminal 17 through respective resistors 19 and 21, each having a low value on the order of one ohm. The collectors of transistors 13 and 15 are connected respectively to positive and negative voltage sources $\pm V_1$ through first and second voltage limiting or regulating means 23 and 25, hereinafter described.

Transistor 13 is driven by a pair of NPN transistors 27 and 29, the three transistors 13, 27, 29 being connected in a Darlington compound connection. Specifically, the base of transistor 13 is connected to the emitter of transistor 27 through a biasing resistor 31, and the base of transistor 27 is connected to the emitter of transistor 29 through a biasing resistor 33. The collectors of transistors 13, 27 and 29 are connected in parallel to the voltage regulating means 23. Similarly, transistor 15 is coupled in a Darlington compound connection to the PNP transistors 35 and 37, with the base of one being connected to the emitter of another through biasing resistors 39 and 41, and the collectors of the three transistors being connected in parallel to the voltage regulating means 25. Additionally, the emitters of transistors 27 and 35 are interconnected through a biasing resistor 43, and the emitters of transistors 29 and 37 are interconnected by a biasing resistor 45. The two biasing resistors 43, 45 prevent one of the two pairs of transistors 27, 29 and 35, 37 from being turned off when the other pair is heavily conducting, as described hereinafter.

The input to the amplifier 11 is applied to the base of a transistor 47 which has its emitter connected through a resistor 49 to a source of negative voltage $-V_1$, and its collector connected directly to the base of transistor 37 and through a plurality of biasing diodes 51 to the base of transistor 29. The base of transistor 29 is also connected through a resistor 53 to a source of positive voltage $+V_1$. The value of resistor 53 is high compared to that of resistor 49 and the input signal $E_s$ to the transistor 47 swings a few volts above and below a negative bias voltage having a value close to $-V_1$.

In operation of the amplifier 11, when $E_s$ goes more negative, the transistors 29, 27 and 13 conduct to provide a large positive output signal $E_0$ to the load terminal 17. Simultaneously transistor 15 is cut off; however, driver transistors 35 and 37 are maintained slightly conducting, due to the bias current supplied thereto through resistors 43 and 45, so that there is no undesirable inter-electrode charge build-up in these two transistors. Also, biasing resistors 43 and 45 provide a small leakage current through the collector of transistor 15 for purposes hereinafter described. When $E_s$ changes from more negative to more positive, the three transistors 37, 35 and 15 conduct to provide a large negative output signal to terminal 17, transistor 13 is cut off except for a small leakage current therethrough, and driver transistors 27 and 29 become slightly conducting.

The voltage regulating means 23 and 25 respectively limit the positive and negative voltages applied to the output transistors 13 and 15, so that the non-conducting one of these transistors will not be subjected to a dangerously high emitter to collector voltage. The regulator 23 includes a main regulating transistor 55 having its emitter-collector current path connected in series with the positive voltage source $+V_1$ and the collector of transistor 13. Transistor 55 is driven by two additional transistors 57 and 59 connected in a Darlington compound configuration. Specifically, the base of transistor 55 is connected to the emitter of transistor 57, and the base of the latter is connected through a biasing resistor 61 to the emitter of transistor 59. The collectors of the three transistors 55, 57, and 59 are connected in parallel to the voltage source $+V_1$.

The other voltage regulating means 25 includes a main regulating transistor 63, two driving transistors 65 and 67, and a biasing resistor 69 connected in the same circuit configuration as described above with regard to the regulating means 23. However, the emitter-collector current path of transistor 63 is connected in series with the negative voltage source $-V_1$ and the collector of transistor 15, and the three transistors 63, 65, 67 are of a conductivity type opposite to that of the three transistors 55, 57, 59. In the illustrated embodiment of the invention, transistors 13, 55 are NPN type and transistors 15, 63 are PNP type, and the two transistors 13, 15 are connected in a complementary symmetry configuration.

The voltage regulating means 23, 25 are respectively controlled by first and second voltage dividers responsive to the output signal $E_0$. The first voltage divider is formed by two resistors 71, 73 connected in series between the output terminal 17 and a source of bias voltage $+V_2$ which is more positive than the voltage $+V_1$. The common junction or tap point of resistors 71, 73 is connected to the base input of transistor 59. Similarly, the second voltage divider is formed by two resistors 75, 77 connected in series between the output terminal 17 and a source of bias voltage $-V_2$ which is more negative than the voltage $-V_1$. The tap point of resistors 75, 77 is connected to the base of transistor 67.

The operation of the voltage regulating means 23, 25 is similar for both positive and negative signal amplification, so only the former will be described. When a high positive output voltage $+E_0$ is produced at the terminal 17, the input signal is amplified by transistors 29, 27 and 13, and the output transistor 15 is non-conducting. The small voltage difference $+(V_2-E_0)$ is divided by resistors 71, 73 and applied to the base of transistor 59 to bias the three transistors 59, 57, 55 into heavy conduction. Since both of the series connected transistors 55, 13 are heavily conducting, most of the voltage $+V_1$ appears at the output terminal 17. The complementary output transistor 15 is cut off, so the voltage developed across the series circuit of transistors 15, 63 is the arithmetic sum of the high positive voltage $+E_0$ and the high negative voltage $-V_1$. This large voltage is divided by the two transistors 15, 63 so that the voltage across each is low enough to prevent them from burning out. The voltage dropped across each of the transistors 15, 63 is controlled by a proportion, for example one-half, of the voltage $-(V_2+E_0)$ which is divided by resistors 75, 77 and applied to the base of transistor 67 to bias the three transistors 67, 65, 63 toward non-conduction. However, these three transistors are not cut off, but instead are maintained slightly conducting, due to the bias provided by a resistor 79 connected between the emitters of transistors 57 and 65.

In order to prevent the collector of transistor 15 from floating at some indeterminable voltage, a small leakage current is maintained there-through by the transistors 35, 37 which are biased into slight conduction by the previously described resistors 43, 45. If transistors 35, 37 malfunction or are otherwise cut off so that no leakage current flows through transistor 15, the collector thereof is prevented from going more negative than the voltage at the junction of resistors 75, 77 by a normally reverse-biased clamping diode 81. A similar clamping diode 83 protects transistor 13 during complementary circuit operation wherein a high negative voltage $-E_0$ is produced at the output terminal 17.

The voltage regulating means 23, 25 and their respective voltage divider control circuits are particularly suitable for application with a high speed switching amplifier. Because the main regulating transistors 55, 63 are driven from the power amplifier output, the effects of transistor inter-electrode capacitances are minimized and their response time is fast enough to protect against switching voltage transients.

I claim:

1. A transistor power amplifier providing a dual polarity output comprising:
- push-pull amplifier means including first and second output transistors, each having emitter, base and collector electrodes;
- a common output terminal;
- means respectively coupling the emitters of said first and second output transistors to said common output terminal;
- first and second means for limiting the voltages applied across said first and second output transistors, respectively, each of said voltage limiting means including a regulating transistor having a first main current carrying electrode connected to the collector electrode of the corresponding one of said amplifier output transistors, a second main current carrying electrode connectable to a source of power, and a control input;
- first and second voltage divider means for respectively controlling said first and second voltage limiting means, each of said voltage divider means having a low end terminal connected to said common output terminal, a high end terminal connectable to a voltage source, and an intermediate tap; and
- means for respectively coupling said intermediate taps to the control inputs of their corresponding regulating transistors.

2. The circuit of claim 1 wherein said first push-pull amplifier output transistor and its corresponding regulating transistor are of one conductivity type, and said second amplifier output transistor and its corresponding regulating transistor are of the opposite conductivity type, said first and second output transistors being connected in a complementary symmetry configuration.

3. The circuit of claim 2, further including:
- two main voltage sources of opposite polarity connected respectively to the second main current carrying electrodes of said two regulating transistors and poled to permit current flow therethrough; and
- two bias voltage sources of opposite polarity and larger voltage magnitude than said main voltage sources, said two bias voltage sources being connected respectively to said high end terminals of said first and second voltage divider means and poled to bias said regulating transistors toward non-conduction when their corresponding push-pull amplifier output transistors are non-conducting.

4. The circuit of claim 3, each of said means for coupling said intermediate taps to the control inputs of said regulating transistors including a driver amplifier, each of said driver amplifiers including:
- two transistors of like conductivity type and each having a base, an emitter and a collector;
- means connecting the collectors of said two transistors in parallel to one of said two main voltage sources;
- means connecting the emitter of one of said two transistors to the base of the other;
- means connecting the other emitter of said two transistors to the control input of the corresponding one of said regulating transistors; and
- means connecting the other base of said two transistors to the intermediate tap of the corresponding one of said voltage divider means.

5. The circuit of claim 4 further including first and second protective diode means for respectively interconnecting the intermediate taps of said first and second voltage divider means to the collector electrodes of said first and second push-pull amplifier output transistors, each of said diode means being poled to clamp its corresponding collector electrode to the voltage at the intermediate tap of its corresponding voltage divider means when its corresponding voltage limiting means is inoperative.

References Cited

UNITED STATES PATENTS

| | | | |
|---|---|---|---|
| 3,376,388 | 4/1968 | Reiffin | 330—13 X |
| 3,428,908 | 2/1969 | Locanthi | 330—22 X |

ROY LAKE, Primary Examiner

SIEGFRIED H. GRIMM, Assistant Examiner

U.S. Cl. X.R.

330—14, 15, 17, 18, 19, 22